United States Patent
Kinoshita et al.

(10) Patent No.: US 11,595,038 B2
(45) Date of Patent: Feb. 28, 2023

(54) CONTROL SYSTEM, SWITCH SYSTEM, POWER CONVERTER, METHOD FOR CONTROLLING BIDIRECTIONAL SWITCH ELEMENT, AND PROGRAM

(71) Applicant: Panasonic Intellectual Property Management Co., Ltd., Osaka (JP)

(72) Inventors: Yusuke Kinoshita, Kyoto (JP); Yasuhiro Yamada, Tokyo (JP); Hidekazu Umeda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 170 days.

(21) Appl. No.: 17/256,642

(22) PCT Filed: Jun. 12, 2019

(86) PCT No.: PCT/JP2019/023236
§ 371 (c)(1),
(2) Date: Dec. 28, 2020

(87) PCT Pub. No.: WO2020/004030
PCT Pub. Date: Jan. 2, 2020

(65) Prior Publication Data
US 2021/0265993 A1    Aug. 26, 2021

(30) Foreign Application Priority Data

Jun. 29, 2018 (JP) .............................. JP2018-125451

(51) Int. Cl.
*H03K 17/56* (2006.01)
*H01L 29/20* (2006.01)
(Continued)

(52) U.S. Cl.
CPC ......... *H03K 17/56* (2013.01); *H01L 29/2003* (2013.01); *H01L 29/205* (2013.01); *H01L 29/7786* (2013.01); *H02M 7/537* (2013.01)

(58) Field of Classification Search
CPC ... H03K 17/56; H01L 29/2003; H01L 29/205; H01L 29/7786
See application file for complete search history.

(56) References Cited

U.S. PATENT DOCUMENTS

2011/0305054 A1  12/2011  Yamagiwa et al.
2013/0009678 A1   1/2013  Morita et al.
(Continued)

FOREIGN PATENT DOCUMENTS

JP    2011-151528       8/2011
JP    2011151528 A  *  8/2011
(Continued)

OTHER PUBLICATIONS

International Search Report issued in corresponding International Patent Application No. PCT/JP2019/023236, dated Sep. 17, 2019, with English translation.

*Primary Examiner* — Metasebia T Retebo
(74) *Attorney, Agent, or Firm* — McDermott Will & Emery LLP

(57) ABSTRACT

A control system includes a control unit. When turning a bidirectional switch element ON, the control unit controls the bidirectional switch element to cause a time lag between a first timing and a second timing. The first timing is a timing when a voltage equal to or higher than a threshold voltage is applied to one gate electrode selected from a first gate electrode and a second gate electrode. The one gate electrode is associated with one source electrode selected from a first source electrode and a second source electrode and having a lower potential than the other source electrode. The second timing is a timing when a voltage equal to or higher (Continued)

than a threshold voltage is applied to the other gate electrode associated with the other source electrode having a higher potential than the one source electrode.

9 Claims, 9 Drawing Sheets

(51) Int. Cl.
*H01L 29/205* (2006.01)
*H01L 29/778* (2006.01)
*H02M 7/537* (2006.01)

(56) References Cited

U.S. PATENT DOCUMENTS

| | | | |
|---|---|---|---|
| 2014/0175455 A1* | 6/2014 | Tanimoto | H01L 29/432 |
| | | | 438/197 |
| 2015/0263162 A1* | 9/2015 | Nishiguchi | H01L 29/404 |
| | | | 257/331 |

FOREIGN PATENT DOCUMENTS

| | | | | | |
|---|---|---|---|---|---|
| JP | 2011-172298 A | | 9/2011 | | |
| JP | 2011172298 A | * | 9/2011 | | H02M 1/08 |
| JP | 2011-204993 A | | 10/2011 | | |
| JP | 2012-004253 | | 1/2012 | | |

* cited by examiner

US 11,595,038 B2

CONTROL SYSTEM, SWITCH SYSTEM, POWER CONVERTER, METHOD FOR CONTROLLING BIDIRECTIONAL SWITCH ELEMENT, AND PROGRAM

CROSS-REFERENCE OF RELATED APPLICATIONS

This application is the U.S. National Phase under 35 U.S.C. § 371 of International Patent Application No. PCT/JP2019/023236, filed on Jun. 12, 2019, which in turn claims the benefit of Japanese Application No. 2018-125451, filed on Jun. 29, 2018, the entire disclosures of which Applications are incorporated by reference herein.

TECHNICAL FIELD

The present disclosure generally relates to a control system, a switch system, a power converter, a method for controlling a bidirectional switch element, and a program. More particularly, the present disclosure relates to a control system for controlling a bidirectional switch element with two gate electrodes, a switch system including such a control system, a power converter including such a switch system, a method for controlling the bidirectional switch element, and a program.

BACKGROUND ART

A bidirectional switch element, which is a double-gate (also called "dual-gate") semiconductor element, has been proposed in the art (see Patent Literature 1).

In the bidirectional switch element of Patent Literature 1, a semiconductor multilayer structure is formed over an electrically conductive substrate of silicon with a buffer layer of MN interposed between the substrate and the multilayer structure. In the semiconductor multilayer structure, a first layer of undoped GaN (GaN layer) and a second layer of undoped AlGaN (first AlGaN layer) are stacked in this order from the bottom.

A channel region as a two-dimensional electron gas layer is generated in the vicinity of a heterojunction between the first layer and the second layer.

On the semiconductor multilayer structure, a first ohmic electrode (first source electrode) and a second ohmic electrode (second source electrode) are arranged to be spaced apart from each other. In a region between the first and second ohmic electrodes on the semiconductor multilayer structure, a first gate electrode, formed over the semiconductor multilayer structure with a first p-type nitride semiconductor layer interposed, and a second gate electrode, formed over the semiconductor multilayer structure with a second p-type nitride semiconductor layer interposed, are arranged side by side from the first ohmic electrode toward the second ohmic electrode.

When the bidirectional switch element of Patent Literature 1 is used with the substrate electrically floating, for example, the switching rate thereof when the switch element is turned ON decreases compared to a situation where the bidirectional switch element is used with the substrate grounded.

CITATION LIST

Patent Literature

Patent Literature 1: JP 2011-204993 A

SUMMARY OF INVENTION

It is therefore an object of the present disclosure to provide a control system, a switch system, a power converter, a method for controlling a bidirectional switch element, and a program, all of which are configured or designed to increase the switching rate when the bidirectional switch element is turned ON.

A control system according to an aspect of the present disclosure is designed to control a bidirectional switch element. The bidirectional switch element includes a substrate, a first nitride semiconductor layer, a second nitride semiconductor layer, a first source electrode, a first gate electrode, a second gate electrode, a second source electrode, a first p-type nitride semiconductor layer, and a second p-type nitride semiconductor layer. The first nitride semiconductor layer is formed over the substrate. The second nitride semiconductor layer is formed on the first nitride semiconductor layer. The second nitride semiconductor layer has a larger bandgap than the first nitride semiconductor layer. The first source electrode, the first gate electrode, the second gate electrode, and the second source electrode are all formed over the second nitride semiconductor layer. The first p-type nitride semiconductor layer is interposed between the first gate electrode and the second nitride semiconductor layer. The second p-type nitride semiconductor layer is interposed between the second gate electrode and the second nitride semiconductor layer. The control system includes a control unit. The control unit controls, when turning the bidirectional switch element ON, the bidirectional switch element to cause a time lag between a first timing and a second timing. The first timing is a timing when a voltage equal to or higher than a threshold voltage is applied to one gate electrode selected from the group consisting of the first gate electrode and the second gate electrode. The one gate electrode is associated with one source electrode selected from the group consisting of the first source electrode and the second source electrode and having a lower potential than the other source electrode. The second timing is a timing when a voltage equal to or higher than a threshold voltage is applied to the other gate electrode associated with the other source electrode having a higher potential than the one source electrode.

A switch system according to another aspect of the present disclosure includes the control system described above and the bidirectional switch element.

A power converter according to still another aspect of the present disclosure includes the switch system described above.

In a method for controlling a bidirectional switch element according to yet another aspect of the present disclosure, the bidirectional switch element includes a substrate, a first nitride semiconductor layer, a second nitride semiconductor layer, a first source electrode, a first gate electrode, a second gate electrode, a second source electrode, a first p-type nitride semiconductor layer, and a second p-type nitride semiconductor layer. The first nitride semiconductor layer is formed over the substrate. The second nitride semiconductor layer is formed on the first nitride semiconductor layer. The second nitride semiconductor layer has a larger bandgap than the first nitride semiconductor layer. The first source electrode, the first gate electrode, the second gate electrode, and the second source electrode are all formed over the second nitride semiconductor layer. The first p-type nitride semiconductor layer is interposed between the first gate electrode and the second nitride semiconductor layer. The second p-type nitride semiconductor layer is interposed between the second gate electrode and the second nitride semiconductor layer. The method for controlling the bidirectional switch element includes controlling, when turning the bidirectional switch element ON, the bidirectional switch element to cause a time lag between a first timing and a second timing. The first timing is a timing when a voltage equal to or higher than a threshold voltage is applied to one gate electrode selected from the group consisting of the first gate electrode and the second gate electrode. The one gate electrode is associated with one source electrode selected from the group consisting of the first source electrode and the second source electrode and having a lower potential than the other source electrode. The second timing is a timing when a voltage equal to or higher than a threshold voltage is applied to the other gate electrode associated with the other source electrode having a higher potential than the one source electrode.

A program according to yet another aspect of the present disclosure is designed to cause a computer system to perform delay processing. The computer system controls a bidirectional switch element. The bidirectional switch element includes a substrate, a first nitride semiconductor layer, a second nitride semiconductor layer, a first source electrode, a first gate electrode, a second gate electrode, a second source electrode, a first p-type nitride semiconductor layer, and a second p-type nitride semiconductor layer. The first nitride semiconductor layer is formed over the substrate. The second nitride semiconductor layer is formed on the first nitride semiconductor layer. The second nitride semiconductor layer has a larger bandgap than the first nitride semiconductor layer. The first source electrode, the first gate electrode, the second gate electrode, and the second source electrode are all formed over the second nitride semiconductor layer. The first p-type nitride semiconductor layer is interposed between the first gate electrode and the second nitride semiconductor layer. The second p-type nitride semiconductor layer is interposed between the second gate electrode and the second nitride semiconductor layer. The delay processing includes causing, when turning the bidirectional switch element ON, a time lag between a first timing and a second timing. The first timing is a timing when a voltage equal to or higher than a threshold voltage is applied to one gate electrode selected from the group consisting of the first gate electrode and the second gate electrode. The one gate electrode is associated with one source electrode selected from the group consisting of the first source electrode and the second source electrode and having a lower potential than the other source electrode. The second timing is a timing when a voltage equal to or higher than a threshold voltage is applied to the other gate electrode associated with the other source electrode having a higher potential than the one source electrode.

BRIEF DESCRIPTION OF DRAWINGS

FIG. 3 shows how the control system operates when turning the bidirectional switch element ON;

DESCRIPTION OF EMBODIMENTS

Figure 2:
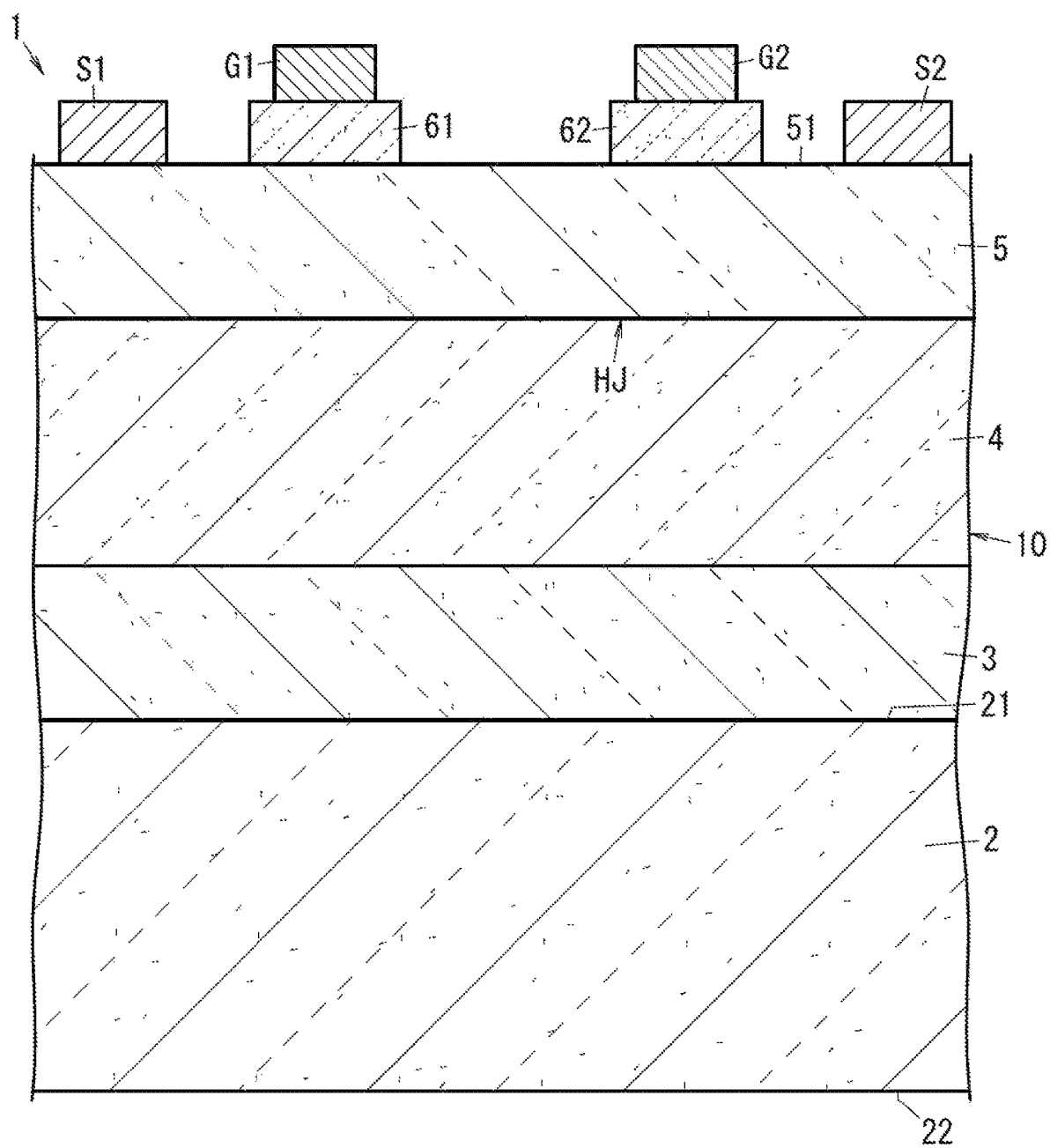
FIG. 2 is a cross-sectional view of a bidirectional switch element in a switch system including the control system.

FIG. 2 to be referred to in the following description of embodiments is a schematic representation. That is to say, the ratio of the dimensions (including thicknesses) of respective constituent elements illustrated in FIG. 2 does not always reflect their actual dimensional ratio.

Embodiments

A switch system 200 including a control system 100 according to an exemplary embodiment will be described with reference to FIGS. 1A and 1B.

The switch system 200 includes a bidirectional switch element 1 and the control system 100 for controlling the bidirectional switch element 1.

In the following description, the bidirectional switch element 1 will be described first with reference to FIG. 2 before the control system 100 is described.

(1) Bidirectional Switch Element (1.1) Configuration for Bidirectional Switch Element The bidirectional switch element 1 includes a substrate 2, a first nitride semiconductor layer 4, a second nitride semiconductor layer 5, a first source electrode S1, a first gate electrode G1, a second gate electrode G2, a second source electrode S2, a first p-type nitride semiconductor layer 61, and a second p-type nitride semiconductor layer 62.

The first nitride semiconductor layer 4 is formed over the substrate 2. The second nitride semiconductor layer 5 is formed on the first nitride semiconductor layer 4. The second nitride semiconductor layer 5 has a larger bandgap than the first nitride semiconductor layer 4. The first source electrode S1 is formed on the second nitride semiconductor layer 5. The first gate electrode G1 is formed over the second nitride semiconductor layer 5 and spaced from the first source electrode S1. The second gate electrode G2 is formed over the second nitride semiconductor layer 5 and is spaced from the first gate electrode G1 to be located opposite from the first source electrode S1 with respect to the first gate electrode G1. The second source electrode S2 is formed on the second nitride semiconductor layer 5 and is spaced from the second gate electrode G2 to be located opposite from the first gate electrode G1 with respect to the second gate electrode G2. The first p-type nitride semiconductor layer 61 is interposed between the first gate electrode G1 and the second nitride semiconductor layer 5. The second p-type nitride semiconductor layer 62 is interposed between the second gate electrode G2 and the second nitride semiconductor layer 5. In this bidirectional switch element 1, a multilayer stack 10 including the first nitride semiconductor layer 4, the second nitride semiconductor layer 5, the first p-type nitride semiconductor layer 61, and the second nitride semiconductor layer 62 is formed over the substrate 2.

The bidirectional switch element 1 will now be described in further detail.

The bidirectional switch element 1 may be implemented as, for example, a dual-gate type GaN-based gate injection transistor (GIT). In this embodiment, the first nitride semiconductor layer 4 is configured as a GaN layer and the second nitride semiconductor layer 5 is configured as an AlGaN layer. The second nitride semiconductor layer 5 is formed on the first nitride semiconductor layer 4 and forms, along with the first nitride semiconductor layer 4, a heterojunction HJ. In a region, located near the heterojunction HJ, of the first nitride semiconductor layer 4, a two-dimensional electron gas has been produced. The region including the two-dimensional electron gas (hereinafter also referred to as a "two-dimensional electron gas layer") may serve as an n-channel layer (electron conduction layer). Also, in the bidirectional switch element 1, each of the first p-type nitride semiconductor layer 61 and the second p-type nitride semiconductor layer 62 is configured as a p-type AlGaN layer.

The substrate 2 is an electrically conductive silicon substrate. Thus, the substrate 2 is a type of electrically conductive substrate. The substrate 2 has a first principal surface 21 and a second principal surface 22. The first principal surface 21 and second principal surface 22 of the substrate 2 are perpendicular to the thickness direction defined for the substrate 2. As used herein, if these surfaces are "perpendicular to" the thickness direction, the surfaces may naturally be exactly perpendicular to the thickness direction but may also be substantially perpendicular to the thickness direction (e.g., when the angle formed between the thickness direction and the first or second principal surface 21, 22 is 90±5 degrees). The second principal surface 22 is located opposite from the first principal surface 21 in the thickness direction defined for the substrate 2. In the bidirectional switch element 1, the multilayer stack 10 is formed over the first principal surface 21 of the substrate 2. The first principal surface 21 of the substrate 2 may be a (111) plane, for example. Alternatively, the first principal surface 21 of the substrate 2 may also be a crystallographic plane, of which an off-axis angle with respect to the (111) plane (hereinafter referred to as a "first off-axis angle") is greater than 0 degrees and equal to or less than 5 degrees. As used herein, the "first off-axis angle" indicates a tilt angle defined by the first principal surface 21 with respect to the (111) plane. Thus, if the off-axis angle is 0 degrees, then the first principal surface 21 is a (111) plane. The (111) plane is a crystallographic plane represented by three Miller indices enclosed in parentheses. The substrate 2 may have a thickness of 100 μm to 1000 μm, for example.

The first nitride semiconductor layer 4 is formed over the substrate 2 with a buffer layer 3 interposed between the first nitride semiconductor layer 4 and the substrate 2. In this embodiment, the multilayer stack 10 includes the buffer layer 3. In the multilayer stack 10, the buffer layer 3, the first nitride semiconductor layer 4, and the second nitride semiconductor layer 5 are arranged in this order and stacked one on top of another on the substrate 2. In addition, the multilayer stack 10 further includes the first p-type nitride semiconductor layer 61 and second p-type nitride semiconductor layer 62, both of which are formed on the second nitride semiconductor layer 5.

The multilayer stack 10 includes epitaxially grown layers grown on the substrate 2 by metalorganic vapor phase epitaxy (MOVPE), for example. When an MOVPE system is used as an epitaxial growth system for growing the multilayer stack 10 on the substrate 2, trimethylaluminum (TMAl) is suitably used as an Al source gas, trimethylgallium (TMGa) is suitably used as a Ga source gas, and $NH_3$ is suitably used as an N source gas. As a source gas for Mg, which is a dopant imparting p-type conductivity, bis(cyclopentadienyl)magnesium ($Cp_2Mg$) is suitably used. A carrier gas for the respective source gases is suitably an $H_2$ gas, for example. The source gases are not particularly limited to the ones exemplified above. Alternatively, triethylgallium (TEGa) may also be used as a Ga source gas, and a hydrazine derivative may also be used as an N source gas, for example.

The buffer layer 3 may be an undoped GaN layer, for example. The buffer layer 3 is provided for the purpose of improving the crystallinity of the first nitride semiconductor layer 4, the second nitride semiconductor layer 5, the first p-type nitride semiconductor layer 61, and the second p-type nitride semiconductor layer 62. The buffer layer 3 is formed directly on the first principal surface 21 of the substrate 2. The undoped GaN layer serving as the buffer layer 3 may include Mg, H, Si, C, O, and other impurities to be inevitably contained therein during its growth. The buffer layer 3 may have a thickness of 100 nm to 3000 nm, for example.

The first nitride semiconductor layer 4 is an undoped GaN layer. The undoped GaN layer serving as the first nitride semiconductor layer 4 may include Mg, H, Si, C, O, and other impurities to be inevitably contained therein during its growth. The first nitride semiconductor layer 4 may have a thickness of 100 nm to 700 nm, for example.

The second nitride semiconductor layer 5 is an undoped AlGaN layer. The undoped AlGaN layer serving as the second nitride semiconductor layer 5 may include Mg, H, Si, C, O, and other impurities to be inevitably contained therein during its growth. The undoped AlGaN layer serving as the second nitride semiconductor layer 5 may have an Al composition ratio of 0.2, for example. As used herein, the "Al composition ratio" refers to an x value when an AlGaN layer is expressed by the general formula $Al_xGa_{1-x}N$. That is to say, the second nitride semiconductor layer 5 is an undoped $Al_{0.2}Ga_{0.8}N$ layer. The composition ratio may be a value obtained by composition analysis according to energy dispersive X-ray spectroscopy (EDX). When their magnitudes are discussed, the composition ratios do not have to be values obtained by the EDX but may also be values obtained by composition analysis according to Auger electron spectroscopy or composition analysis according to secondary ion mass spectroscopy (SIMS), for example. The second nitride semiconductor layer 5 may have a thickness of 20 nm to 100 nm, for example.

Each of the first p-type nitride semiconductor layer 61 and the second p-type nitride semiconductor layer 62 may be configured as a p-type AlGaN layer.

The first p-type nitride semiconductor layer 61 and the second p-type nitride semiconductor layer 62 each cover only a part of the surface 51 of the second nitride semiconductor layer 5. Thus, the surface 51 of the second nitride semiconductor layer 5 includes regions covered with the first p-type nitride semiconductor layer 61 and the second p-type nitride semiconductor layer 62 and regions covered with neither the first p-type nitride semiconductor layer 61 nor the second p-type nitride semiconductor layer 62. The first p-type nitride semiconductor layer 61 and the second p-type nitride semiconductor layer 62 are spaced apart from each other. The first p-type nitride semiconductor layer 61 and the second p-type nitride semiconductor layer 62 are doped with Mg during their growth and contain Mg. The first p-type nitride semiconductor layer 61 and the second p-type nitride semiconductor layer 62 are formed by growing, using an MOVPE system, a p-type nitride semiconductor layer as a prototype of the first p-type nitride semiconductor layer 61 and the second p-type nitride semiconductor layer 62 on the second nitride semiconductor layer 5 and then patterning the p-type nitride semiconductor layer by photolithographic and etching techniques.

The Al composition ratio of the first p-type nitride semiconductor layer 61 and the second p-type nitride semiconductor layer 62 may be the same as the Al composition ratio of the AlGaN layer serving as the second nitride semiconductor layer 5 (and may be 0.2, for example). However, the Al composition ratio of the first p-type nitride semiconductor layer 61 and second p-type nitride semiconductor layer 62 may be different from that of the AlGaN layer serving as the second nitride semiconductor layer 5. The first p-type nitride semiconductor layer 61 and the second p-type nitride semiconductor layer 62 may each have a thickness of 50 nm to 300 nm, for example.

The first source electrode S1 and the second source electrode S2 are formed in regions, covered with neither the first p-type nitride semiconductor layer 61 nor the second p-type nitride semiconductor layer 62, of the surface 51 of the second nitride semiconductor layer 5. The first source electrode S1 and the second source electrode S2 are spaced apart from each other. The first source electrode S1 and the second source electrode S2 are electrically connected to the heterojunction HJ. As used herein, if two members are "electrically connected together," then it means that the two members are in ohmic contact with each other. The first source electrode S1 and the second source electrode S2 may each contain Ti and Al, for example.

The first gate electrode G1 is formed over the second nitride semiconductor layer 5 with the first p-type nitride semiconductor layer 61 interposed between the first gate electrode G1 and the second nitride semiconductor layer 5. The second gate electrode G2 is formed over the second nitride semiconductor layer 5 with the second p-type nitride semiconductor layer 62 interposed between the second gate electrode G2 and the second nitride semiconductor layer 5. The gap distance between the first gate electrode G1 and the second gate electrode G2 is longer than the gap distance between the first p-type nitride semiconductor layer 61 and the second p-type nitride semiconductor layer 62. Each of the first gate electrode G1 and the second gate electrode G2 is spaced from an associated one of the first source electrode S1 and second source electrode S2 in the direction along the surface 51 of the second nitride semiconductor layer 5. The first gate electrode G1 and second gate electrode G2 may be in ohmic contact with the first p-type nitride semiconductor layer 61 and the second p-type nitride semiconductor layer 62, respectively. Each of the first gate electrode G1 and the second gate electrode G2 contains Pd and Au, for example.

In the bidirectional switch element 1, the first source electrode S1, the first gate electrode G1, the second gate electrode G2, and the second source electrode S2 are arranged side by side in this order in one direction along the surface 51 of the second nitride semiconductor layer 5. The first source electrode S1, the first gate electrode G1, the second gate electrode G2, and the second source electrode S2 are spaced apart from each other in the one direction.

(1.2) Operation of Bidirectional Switch Element

In the following description, a state where no voltage equal to or higher than a first threshold voltage is applied between the first gate electrode G1 and the first source electrode S1 will be hereinafter referred to as a state where the first gate electrode G1 is OFF for the sake of convenience. On the other hand, a state where a voltage equal to or higher than the first threshold voltage is applied between the first gate electrode G1 and the first source electrode S1 with the first gate electrode G1 having the higher potential will be hereinafter referred to as a state where the first gate electrode G1 is ON. Also, a state where no voltage equal to or higher than a second threshold voltage is applied between the second gate electrode G2 and the second source electrode S2 will be hereinafter referred to as a state where the second gate electrode G2 is OFF. On the other hand, a state where a voltage equal to or higher than the second threshold voltage is applied between the second gate electrode G2 and the second source electrode S2 with the second gate electrode G2 having the higher potential will be hereinafter referred to as a state where the second gate electrode G2 is ON.

This bidirectional switch element 1 includes the first p-type nitride semiconductor layer 61 and the second p-type nitride semiconductor layer 62, thereby operating as a normally OFF transistor. In this case, when the first gate electrode G1 is OFF, the first p-type nitride semiconductor layer 61 forms a depletion layer right under the first p-type nitride semiconductor layer 61 such that the depletion layer runs through the second nitride semiconductor layer 5 to reach the first nitride semiconductor layer 4. When the second gate electrode G2 is OFF, the second p-type nitride semiconductor layer 62 forms a depletion layer right under the second p-type nitride semiconductor layer 62 such that the depletion layer runs through the second nitride semiconductor layer 5 to reach the first nitride semiconductor layer 4. In the state where the first gate electrode G1 is ON, the bidirectional switch element 1 may connect the first gate electrode G1 and the first source electrode S1 with the two-dimensional electron gas layer. In other words, while the first gate electrode G1 is ON, the bidirectional switch element 1 prevents the depletion layer from cutting off the two-dimensional electron gas layer between the first gate electrode G1 and the first source electrode S1. In addition, in the state where the second gate electrode G2 is ON, the bidirectional switch element 1 may connect the second gate electrode G2 and the second source electrode S2 with the two-dimensional electron gas layer. In other words, while the second gate electrode G2 is ON, the bidirectional switch element 1 prevents the depletion layer from cutting off the two-dimensional electron gas layer between the second gate electrode G2 and the second source electrode S2.

In a state where the first gate electrode G1 is OFF and the second gate electrode G2 is OFF (i.e., in a first operation mode), the bidirectional switch element 1 is unable to allow a current to flow in any direction between the first source electrode S1 and the second source electrode S2. More specifically, in the first operation mode, a current flowing from the first source electrode S1 toward the second source electrode S2 is cut off when the first source electrode S1 has a higher potential than the second source electrode S2 and a current flowing from the second source electrode S2 toward the first source electrode S1 is also cut off when the second source electrode S2 has a higher potential than the first source electrode S1.

In a state where the first gate electrode G1 is ON and the second gate electrode G2 is ON (i.e., in a second operation mode), the bidirectional switch element 1 allows a current to flow bidirectionally between the first source electrode S1 and the second source electrode S2. More specifically, in the second operation mode, a current flows from the first source electrode S1 toward the second source electrode S2 when the first source electrode S1 has a higher potential than the second source electrode S2 and a current flows from the second source electrode S2 toward the first source electrode S1 when the second source electrode S2 has a higher potential than the first source electrode S1.

In a state where the first gate electrode G1 is ON and the second gate electrode G2 is OFF (i.e., in a third operation mode), the bidirectional switch element 1 serves as a diode. More specifically, in the third operation mode, a current flowing from the first source electrode S1 toward the second source electrode S2 is cut off when the first source electrode S1 has a higher potential than the second source electrode S2 and a current flows from the second source electrode S2 toward the first source electrode S1 when the second source electrode S2 has a potential higher by at least the second threshold voltage than the first source electrode S1.

In a state where the first gate electrode G1 is OFF and the second gate electrode G2 is ON (i.e., in a fourth operation mode), the bidirectional switch element 1 serves as a diode. More specifically, in the fourth operation mode, a current flowing from the second source electrode S2 toward the first source electrode S1 is cut off when the second source electrode S2 has a higher potential than the first source electrode S1 and a current flows from the first source electrode S1 toward the second source electrode S2 when the first source electrode S1 has a potential higher by at least the first threshold voltage than the second source electrode S2.

In this bidirectional switch element 1, the first threshold voltage and the second threshold voltage have the same value. However, this is only an example of the present disclosure and should not be construed as limiting. Alternatively, the first threshold voltage and the second threshold voltage may have mutually different values. The first threshold voltage is a threshold voltage at which the depletion layer expanding under the first gate electrode G1 to cut off the two-dimensional electron gas layer shrinks to the point of allowing a current to flow through the two-dimensional electron gas layer. The second threshold voltage is a threshold voltage at which the depletion layer expanding under the second gate electrode G2 to cut off the two-dimensional electron gas layer shrinks to the point of allowing a current to flow through the two-dimensional electron gas layer.

(2) Control System

Figure 1A:
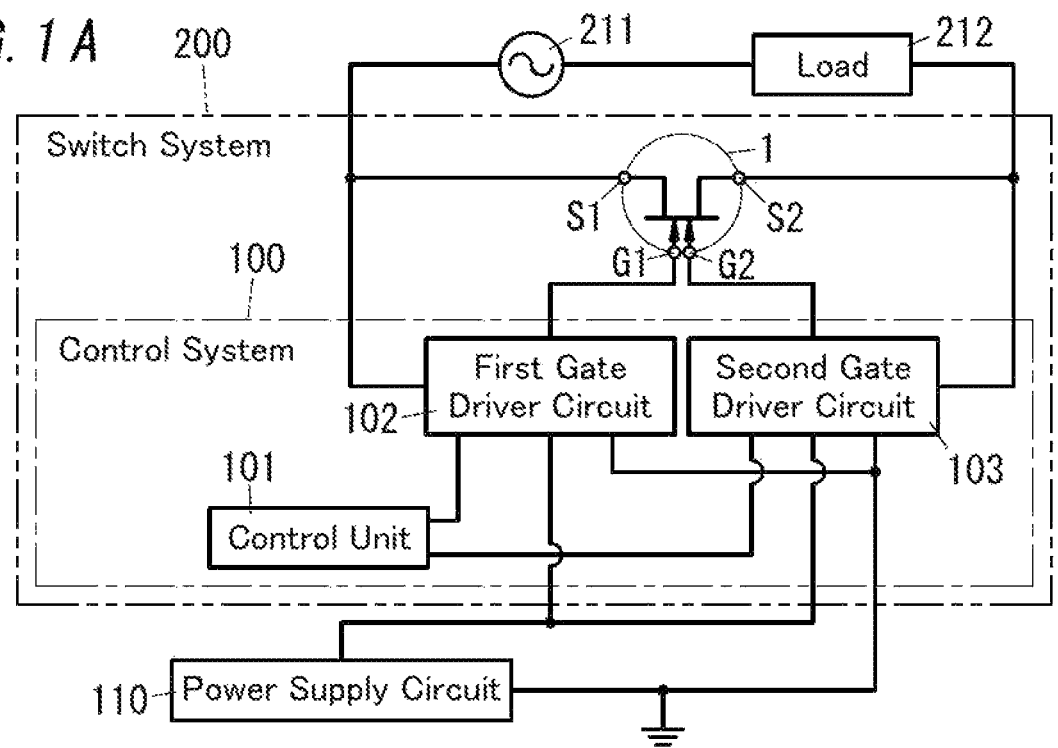
FIG. 1A is a circuit block diagram of a switch system including a control system according to an exemplary embodiment.

As shown in FIG. 1A, the control system 100 includes a control unit 101. The control system 100 includes not only the control unit 101 but also a first gate driver circuit 102 and a second gate driver circuit 103 as well. The control system 100 may be used, for example, with a series circuit of an AC power supply 211 and a load 212 connected between the first source electrode S1 and the second source electrode S2 of the bidirectional switch element 1 as shown in FIG. 1A.

The control unit 101, the first gate driver circuit 102, and the second gate driver circuit 103 are supplied with DC voltage by a power supply circuit 110. The power supply circuit 110 may include, for example: a diode bridge for full-wave rectifying the output voltage of an AC power supply (such as a commercial power supply) 211; a smoothing capacitor for smoothing out the output voltage of the diode bridge; and a voltage step-down chopper circuit for stepping down the output voltage of the smoothing capacitor to the DC voltage. Note that the power supply circuit 110 is not a constituent element of the control system 100. The power supply circuit 110 may have any circuit configuration without limitation.

Figure 3:
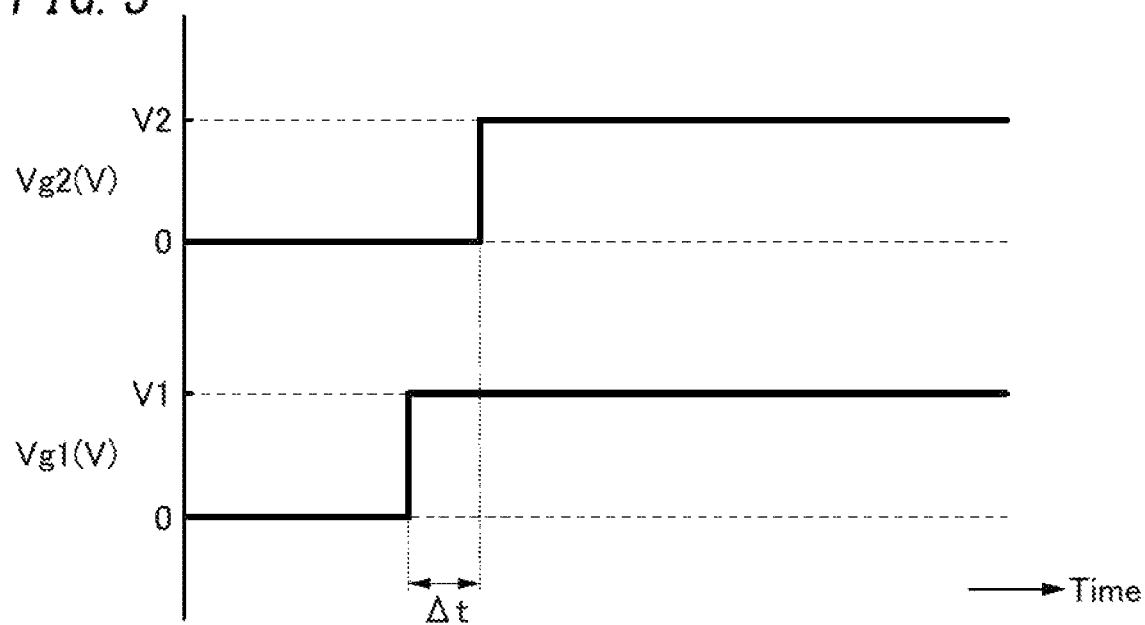

The first gate driver circuit 102 is a circuit for applying a first gate voltage Vg1 between the first gate electrode G1 and the first source electrode S1 with the potential at the first source electrode S1 used as a reference potential (see FIG. 3). The first gate driver circuit 102 is controlled in accordance with a control signal from the control unit 101 to make the first gate voltage Vg1 either a voltage V1 (of 5 V, for example) greater than the first threshold voltage or a voltage (of 0 V, for example) smaller than the first threshold voltage.

The second gate driver circuit 103 is a circuit for applying a second gate voltage Vg2 between the second gate electrode G2 and the second source electrode S2 with the potential at the second source electrode S2 used as a reference potential (see FIG. 3). The second gate driver circuit 103 is controlled in accordance with a control signal from the control unit 101 to make the second gate voltage Vg2 either a voltage V2 (of 5 V, for example) greater than the second threshold voltage or a voltage (of 0 V, for example) smaller than the second threshold voltage.

The control unit 101 controls, when turning the bidirectional switch element 1 ON, the bidirectional switch element 1 to cause a time lag $\Delta t$ (see FIG. 3) between a first timing and a second timing. The first timing is a timing when a voltage equal to or higher than a threshold voltage is applied to one gate electrode selected from the group consisting of the first gate electrode G1 and the second gate electrode G2. The one gate electrode is associated with one source electrode selected from the group consisting of the first source electrode S1 and the second source electrode S2 and having a lower potential than the other source electrode. The second timing is a timing when a voltage equal to or higher than a threshold voltage is applied to the other gate electrode associated with the other source electrode having a higher potential than the one source electrode. The time lag $\Delta t$ is suitably equal to or longer than 50 nanoseconds, for example, with a margin for the control system 100 taken into account. This ensures a time lag $\Delta t$ of 10 nanoseconds or more even when there are any fluctuations or dispersions in the control system 100.

In the interval between the first timing and the second timing, the control unit 101 makes the bidirectional switch element 1 operate as a diode. When operating as a diode during this interval, the bidirectional switch element 1 allows no current to flow from one source electrode having the lower potential and selected from the first source electrode S1 and the second source electrode S2 toward the other source electrode having the higher potential but does allow a current to flow from the other source electrode having the higher potential toward the one source electrode having the lower potential.

When turning the bidirectional switch element 1 ON with the second source electrode S2 having the higher potential than the first source electrode S1, the control unit 101 increases the first gate voltage Vg1 between the first gate electrode G1 and the first source electrode S1 to a value equal to or greater than the first threshold voltage and then increases the second gate voltage Vg2 between the second gate electrode G2 and the second source electrode S2 to a value equal to or greater than the second threshold voltage as shown in FIG. 3. In this case, in the interval between the timing when the first gate voltage Vg1 is applied between the first gate electrode G1 and the first source electrode S1 (i.e., a timing corresponding to the first timing) and the timing when the second gate voltage Vg2 is applied between the second gate electrode G2 and the second source electrode S2 (i.e., a timing corresponding to the second timing), the control unit 101 makes the bidirectional switch element 1 operate as a diode in the third operation mode as described above. This allows the bidirectional switch element 1 to cut off the current flowing from the first source electrode S1 toward the second source electrode S2 when the first source electrode S1 has a higher potential than the second source electrode S2 and to cause a current to flow from the second source electrode S2 toward the first source electrode S1 when the second source electrode S2 has a potential higher by at least the second threshold voltage than the first source electrode S1.

The agent that performs the functions of the control unit 101 includes a computer system. The computer system includes a single or a plurality of computers. The computer system may include, as principal hardware components, a processor and a memory. The functions of the control unit 101 according to the present disclosure may be performed by making the processor execute a program stored in the memory of the computer system. The program may be stored in advance in the memory of the computer system. Alternatively, the program may also be downloaded through a telecommunications line or be distributed after having been recorded in some non-transitory storage medium such as a memory card, an optical disc, or a hard disk drive (magnetic disk), any of which is readable for the computer system. The processor of the computer system may be made up of a single or a plurality of electronic circuits including a semiconductor integrated circuit (IC) or a large-scale integrated circuit (LSI). Those electronic circuits may be either integrated together on a single chip or distributed on multiple chips, whichever is appropriate. Those multiple chips may be integrated together in a single device or distributed in multiple devices without limitation.

Figure 1B:
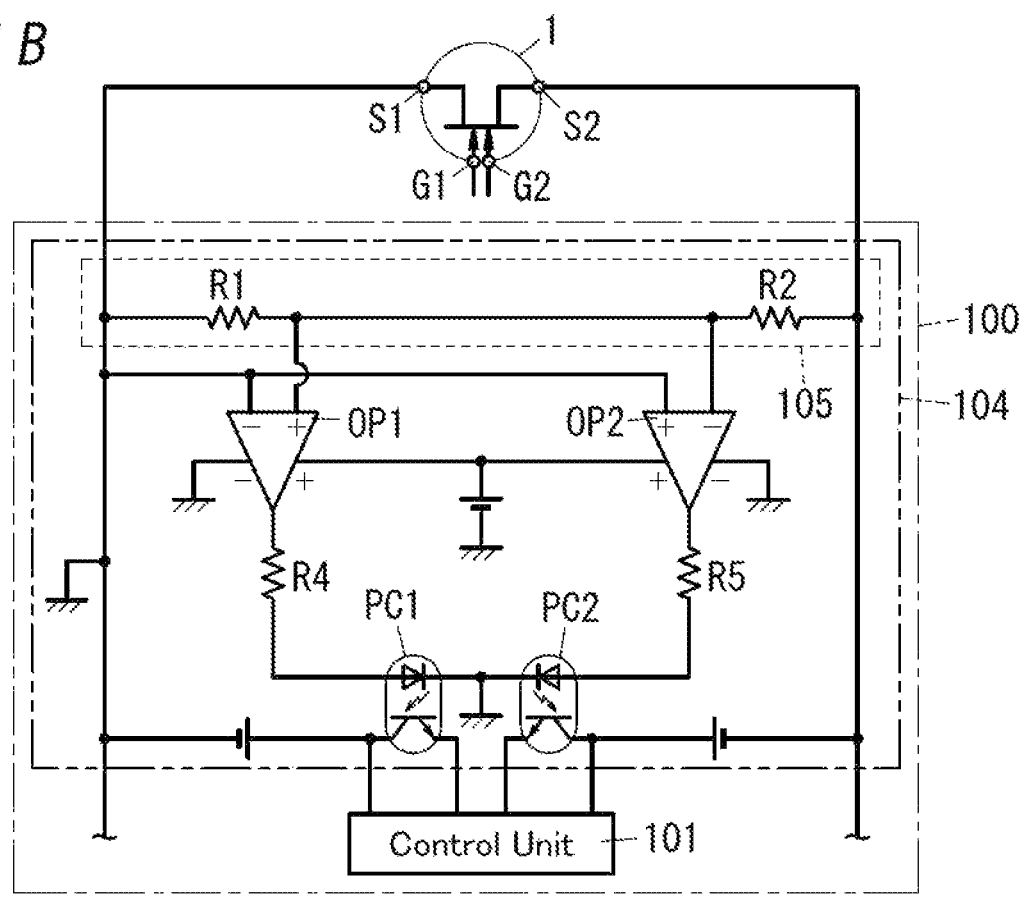
FIG. 1B illustrates a circuit configuration of a part of the control system.

To allow the control unit 101 to determine which of the first source electrode S1 or the second source electrode S2 has the higher potential, the control system 100 includes a detection circuit 104 including a resistance divider circuit 105, a first operational amplifier OP1, a second operational amplifier OP2, a first photocoupler PC1, and a second photocoupler PC2 as shown in FIG. 1B, for example. The resistance divider circuit 105 is a series circuit of a first resistor R1 and a second resistor R2 and is connected between the first source electrode S1 and the second source electrode S2 of the bidirectional switch element 1.

A non-inverting input terminal of the first operational amplifier OP1 and an inverting input terminal of the second operational amplifier OP2 are connected to a node of connection between the first resistor R1 and the second resistor R2 of the resistance divider circuit 105. Thus, a voltage obtained by dividing the voltage between the first source electrode S1 and the second source electrode S2 by the first resistor R1 and the second resistor R2 is applied to the non-inverting input terminal of the first operational amplifier OP1 and the inverting input terminal of the second operational amplifier OP2. Meanwhile, an inverting input terminal of the first operational amplifier OP1 and a non-inverting input terminal of the second operational amplifier OP2 are connected to the first source electrode S1 and grounded. An output terminal of the first operational amplifier OP1 is connected to an anode terminal of a light-emitting diode (LED) of the first photocoupler PC1 via a fourth resistor R4. An output terminal of the second operational amplifier OP2 is connected to an anode terminal of an LED of the second photocoupler PC2 via a fifth resistor R5. Meanwhile, a cathode terminal of the LED of the first photocoupler PC1 and a cathode terminal of the LED of the second photocoupler PC2 are connected to the first source electrode S1 and grounded. A phototransistor of the first photocoupler PC1 and a phototransistor of the second photocoupler PC2 are connected to the control unit 101.

In the detection circuit 104, when the potential at the second source electrode S2 is higher than the potential at the first source electrode S1, the first photocoupler PC1 turns ON and the second photocoupler PC2 turns OFF. On the other hand, in the detection circuit 104, when the potential at the second source electrode S2 is lower than the potential at the first source electrode S1, the first photocoupler PC1 turns OFF and the second photocoupler PC2 turns ON. This allows the control unit 101 to determine, based on the respective states of the first photocoupler PC1 and the second photocoupler PC2 of the detection circuit 104, which of the first source electrode S1 or the second source electrode S2 has the higher potential. Note that the detection circuit 104 does not have to have the configuration shown in FIG. 1B.

Next, the waveform obtained when the bidirectional switch element 1 is turned ON by the control system 100 will be described with reference to FIG. 4.

Figure 4:
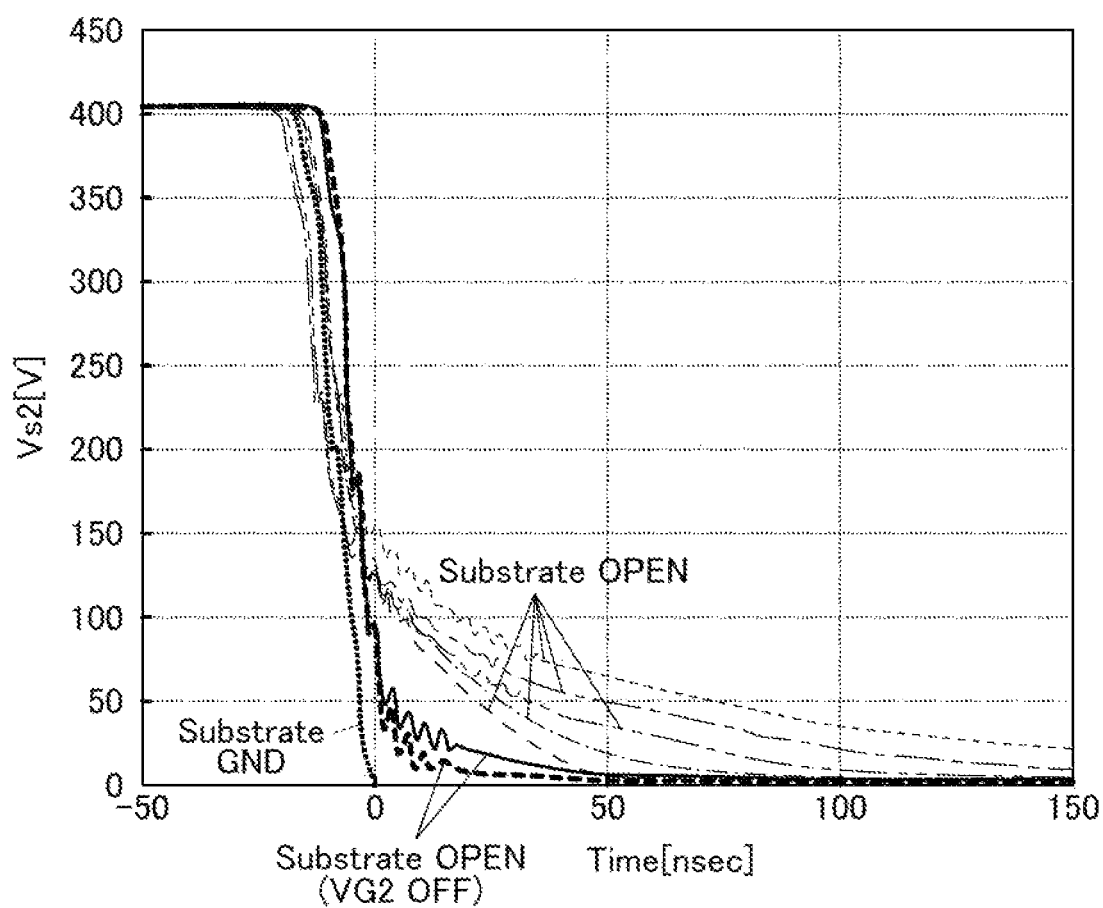
FIG. 4 shows, in comparison, a turn-on waveform of the bidirectional switch element in the switch system including the control system and a turn-on waveform of a bidirectional switch element in a switch system according to a comparative example.

FIG. 4 shows voltage waveforms obtained when the bidirectional switch element 1 is turned ON with a series circuit of a DC power supply and a load connected between the first source electrode S1 and second source electrode S2 of the bidirectional switch element 1. More specifically, FIG. 4 shows voltage waveforms obtained when the bidirectional switch element 1 is turned ON with a positive electrode of the DC power supply connected to the second source electrode S2 and with a negative electrode of the DC power supply connected to the first source electrode S1. In FIG. 4, the ordinate indicates voltage Vs2 between the second source electrode S2 and the first source electrode S1 and the abscissa indicates the time. Note that the time indicated by the abscissa is "positive (+)" on the right of a reference time of 0 nanoseconds and is "negative (−)" on the left of the reference time. One of these signs + and − is added to a given point in time to indicate whether the given point in time is before or after the reference time of 0 nanoseconds.

In FIG. 4, the curves labeled "substrate OPEN (VG2 OFF)" represent variations in Vs2 with time in a situation where the bidirectional switch element 1 is turned ON by the control system 100 according to the first embodiment with the substrate 2 of the bidirectional switch element 1 electrically floating. As used herein, the state where "the substrate 2 is electrically floating" refers to a state where substrate 2 is electrically insulated from all of the first source electrode S1, the second source electrode S2, the first gate electrode G1, and the second gate electrode G2. In addition, the curves labeled "substrate OPEN (VG2 OFF)" in FIG. 4 represent how Vs2 varies with time when the load current is changed, indicating that the smaller the load current is, the higher the switching rate is.

Also, the curve labeled "substrate GND" in FIG. 4 represents a variation in Vs2 with time in a situation where the bidirectional switch element 1 is turned ON with the substrate 2 of the bidirectional switch element 1 grounded and with the application of a first gate voltage, higher than the first threshold voltage, to the first gate electrode G1 of the bidirectional switch element 1 synchronized with the application of a second gate voltage, higher than the second threshold voltage, to the second gate electrode G2.

Furthermore, the curves labeled "substrate OPEN" in FIG. 4 represent variations in Vs2 with time in a situation where the bidirectional switch element 1 is turned ON with the substrate 2 of the bidirectional switch element 1 electrically floating and with the application of a first gate voltage, higher than the first threshold voltage, to the first gate electrode G1 of the bidirectional switch element 1 synchronized with the application of a second gate voltage, higher than the second threshold voltage, to the second gate electrode G2. In addition, the curves labeled "substrate OPEN" in FIG. 4 represent how Vs2 varies with time when the load current is changed, indicating that the smaller the load current is, the higher the switching rate is.

Figure 5:
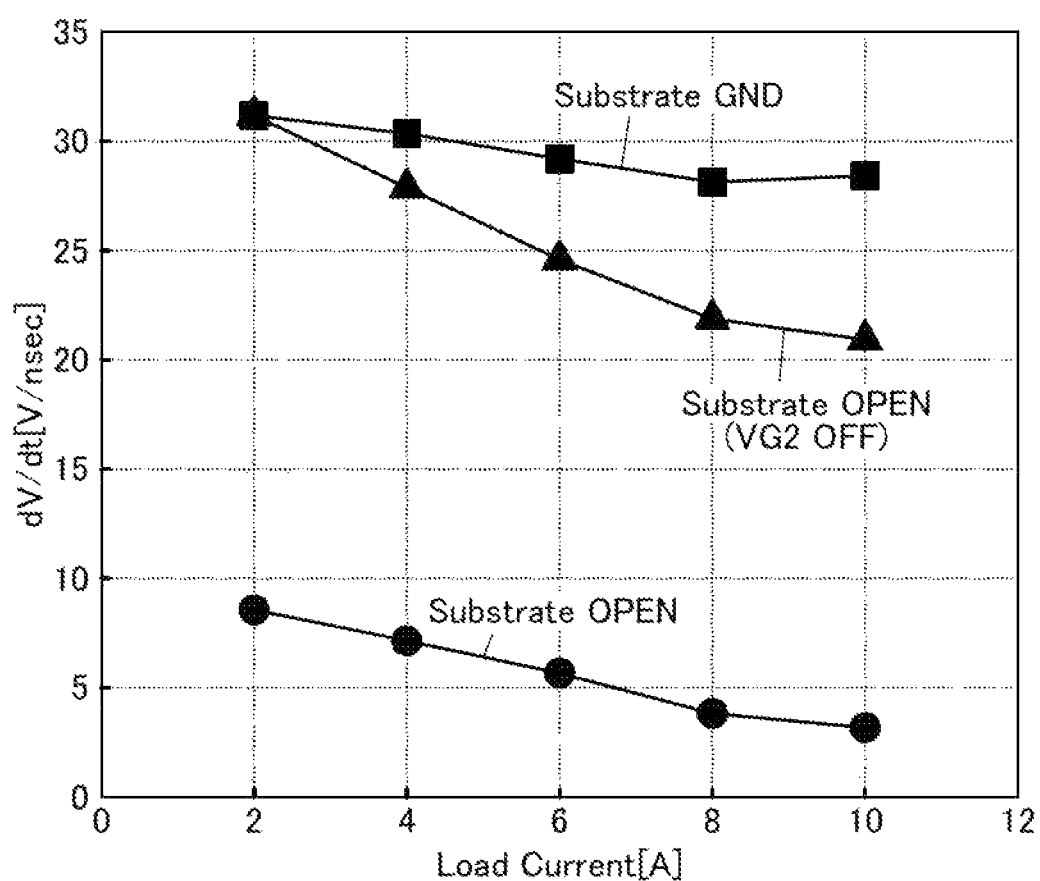
FIG. 5 shows a switching rate of the bidirectional switch element in the switch system including the control system according to the exemplary embodiment and a switching rate according to the comparative example.

FIG. 5 shows how the switching rate of the bidirectional switch element 1 changes with a load current. In FIG. 5, the abscissa indicates a load current and the ordinate indicates the absolute value of dV/dt corresponding to the switching rate of the bidirectional switch element 1 being turned ON. As used herein, the load current refers to a current flowing through the load and dV/dt is a value obtained by dividing, by time, a voltage variation when the voltage Vs2 decreases from a value corresponding to 90% of the maximum value to a value corresponding to 10% of the maximum value.

As can be seen from FIGS. 4 and 5, adopting the control system 100 according to the first embodiment allows the switching rate to be increased when the bidirectional switch element 1 is turned ON with the substrate 2 of the bidirectional switch element 1 electrically floating.

Figure 6:
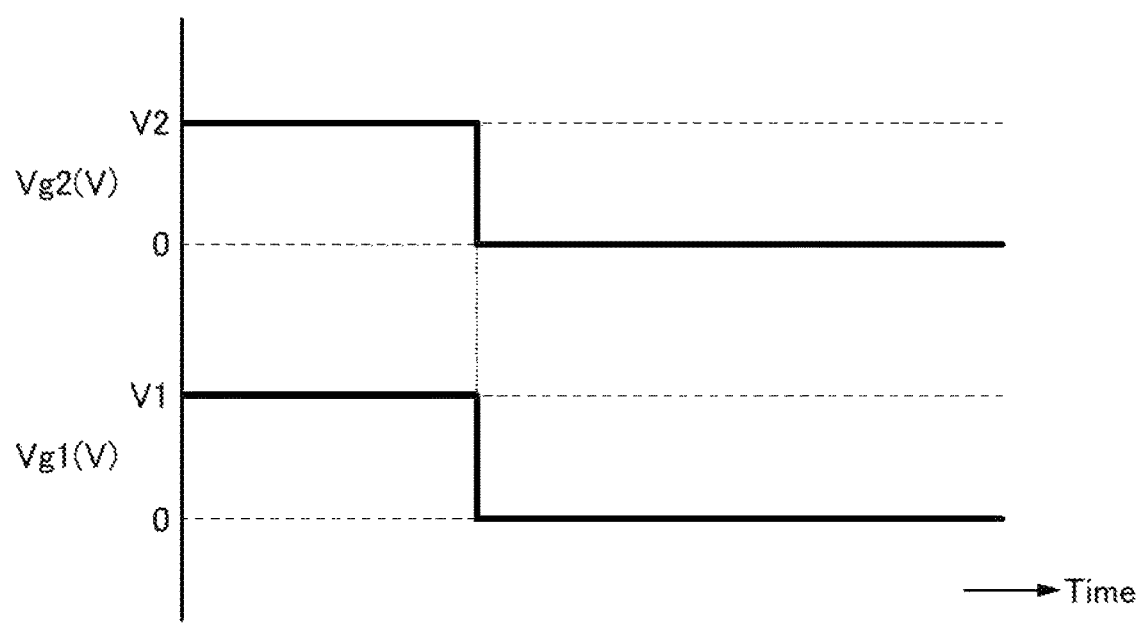
FIG. 6 shows how the control system operates when turning the bidirectional switch element OFF.

When turning the bidirectional switch element 1 OFF, the relation between the timing when the first gate voltage Vg1 is changed from the voltage V1 to 0 V and the timing when the second gate voltage Vg2 is changed from the voltage V2 to 0 V is not particularly defined in the control system 100. Nevertheless, from the point of view of cutting down the loss caused by the bidirectional switch element 1, when turning the bidirectional switch element 1 OFF, the control unit 101 of the control system 100 suitably prevents the bidirectional switch element 1 from operating as a diode. When turning the bidirectional switch element 1 OFF, the control unit 101 prevents the bidirectional switch element 1 from operating as a diode by synchronizing the fall of the first gate voltage Vg1 from the voltage V1 to 0 V with the fall of the second gate voltage Vg2 from the voltage V2 to 0 V as shown in FIG. 6, for example.

A method for controlling the bidirectional switch element 1 includes controlling, when turning the bidirectional switch element 1 ON, the bidirectional switch element 1 to cause a time lag Δt between a first timing and a second timing. The first timing is a timing when a voltage equal to or higher than a threshold voltage is applied to one gate electrode selected from the first gate electrode G1 and the second gate electrode G2. The one gate electrode is associated with one source electrode selected from the first source electrode S1 and the second source electrode S2 and having a lower potential than the other source electrode. The second timing is a timing when a voltage equal to or higher than a threshold voltage is applied to the other gate electrode associated with the other source electrode having a higher potential than the one source electrode.

The program described above is designed to cause a computer system that controls the bidirectional switch element 1 to perform delay processing. The delay processing includes causing, when turning the bidirectional switch element 1 ON, the time lag Δt between the first timing and the second timing. The first timing is a timing when a voltage equal to or higher than a threshold voltage is applied to one gate electrode selected from the first gate electrode G1 and the second gate electrode G2. The one gate electrode is associated with one source electrode selected from the first source electrode S1 and the second source electrode S2 and having a lower potential than the other source electrode. The second timing is a timing when a voltage equal to or higher than a threshold voltage is applied to the other gate electrode associated with the other source electrode having a higher potential than the one source electrode.

Figure 7:
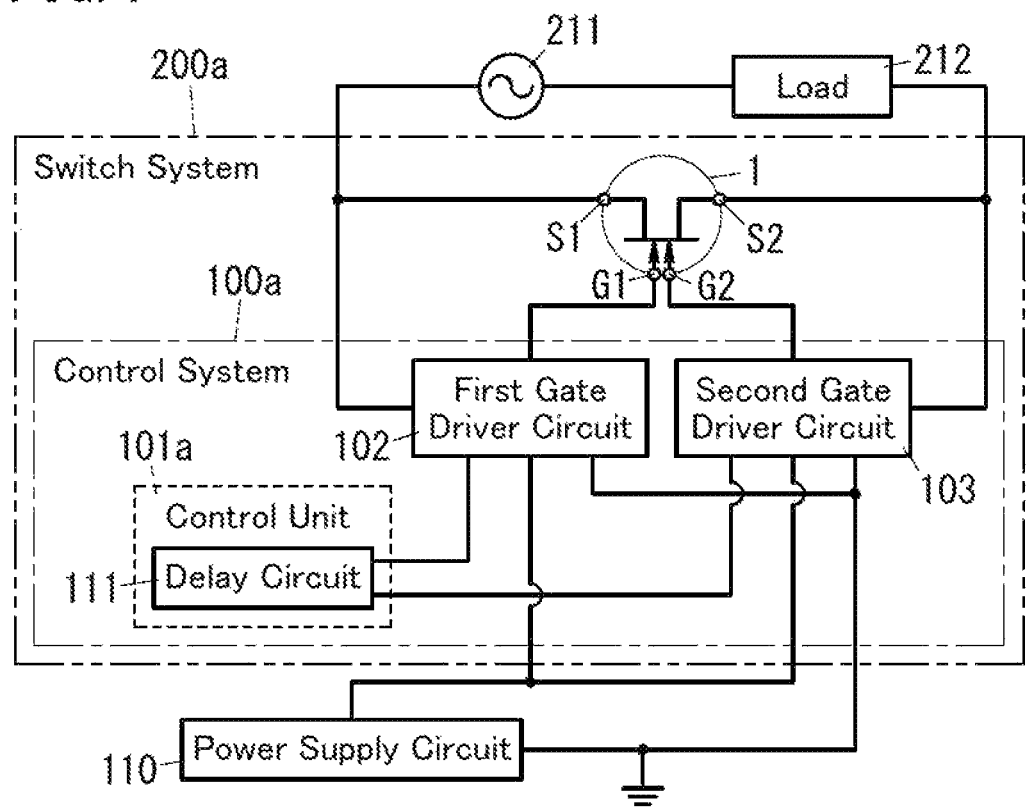
FIG. 7 is a circuit block diagram of a switch system including a control system according to a first variation of the exemplary embodiment.

FIG. 7 is a circuit block diagram of a switch system 200a including a control system 100a according to a first variation of the exemplary embodiment described above. In the following description, any constituent element of the switch system 200a including the control system 100a according to the first variation, having the same function as a counterpart of the switch system 200 including the control system 100 according to the exemplary embodiment (see FIG. 1A), will be designated by the same reference numeral as that counterpart's, and description thereof will be omitted herein.

When turning the bidirectional switch element 1 ON, the control unit 101a, as well as the control unit 101 of the control system 100 according to the exemplary embodiment described above, also controls the bidirectional switch element 1 to cause the time lag Δt (see FIG. 3) between the first timing and the second timing. The first timing is a timing when a voltage equal to or higher than a threshold voltage is applied to one gate electrode selected from the first gate electrode G1 and the second gate electrode G2. The one gate electrode is associated with one source electrode selected from the first source electrode S1 and the second source electrode S2 and having a lower potential than the other source electrode. The second timing is a timing when a voltage equal to or higher than a threshold voltage is applied to the other gate electrode associated with the other source electrode having a higher potential than the one source electrode.

In the control system 100a according to the first variation, the control unit 101a is implemented as an analog circuit and includes a delay circuit 111 for causing the time lag Δt.

Figure 8:
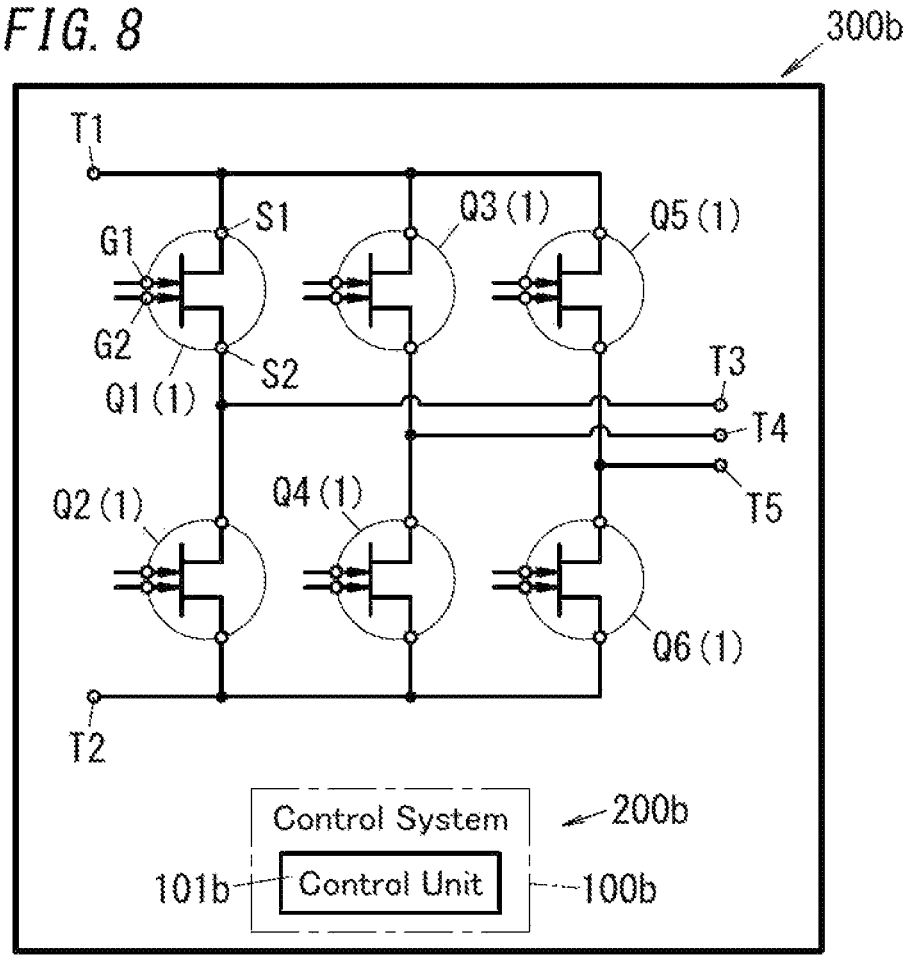
FIG. 8 is a circuit diagram of a power converter including a control system according to a second variation of the exemplary embodiment.

Next, a switch system 200b including a control system 100b according to a second variation of the exemplary embodiment and a power converter 300b including the switch system 200b will be described with reference to FIG. 8.

The power converter 300b is a matrix converter for performing AC-AC conversion. In this variation, the power converter 300b converts a first AC voltage with a first frequency into a second AC voltage with a second frequency different from the first frequency. The second frequency is lower than the first frequency. The power converter 300b includes two input terminals T1, T2 for receiving the first AC voltage. The power converter 300b also includes three output terminals T3, T4, T5 for outputting the second AC voltage. In this variation, the first AC voltage is a single-phase AC voltage and the second AC voltage is a three-phase AC voltage. The power converter 300b further includes six switching elements Q1-Q6, each being implemented as the bidirectional switch element 1. For example, a three-phase AC motor may be connected as a load to the three output terminals T3, T4, T5.

In this power converter 300b, a series circuit of the switching elements Q1, Q2, a series circuit of the switching elements Q3, Q4, and a series circuit of the switching elements Q5, Q6 are connected together in parallel. Each of these series circuits is connected between the two input terminals T1, T2. One output terminal T3 of the three output terminals T3, T4, T5 is connected to a node of connection between the switching elements Q1, Q2, another output terminal T4 is connected to a node of connection between the switching elements Q3, Q4, and the other output terminal T5 is connected to a node of connection between the switching elements Q5, Q6. In this power converter 300b, a power converting unit for performing power conversion includes the six switching elements Q1-Q6. The power converter 300b includes the power converting unit including the bidirectional switch element 1 and performing power conversion and the control system 100b.

In the control system 100b that the power converter 300b includes, the control unit 101b controls the plurality of bidirectional switch elements 1 (namely, the switching elements Q1-Q6). In this variation, when turning each of the plurality of bidirectional switch elements 1 ON, the control unit 101b controls the bidirectional switch element 1 to cause the time lag Δt (see FIG. 3) between the first timing and the second timing. The first timing is a timing when a voltage equal to or higher than a threshold voltage is applied to one gate electrode selected from the first gate electrode G1 and the second gate electrode G2. The one gate electrode is associated with one source electrode selected from the first source electrode S1 and the second source electrode S2 and having a lower potential than the other source electrode. The second timing is a timing when a voltage equal to or higher than a threshold voltage is applied to the other gate electrode associated with the other source electrode having a higher potential than the one source electrode.

Figure 9:
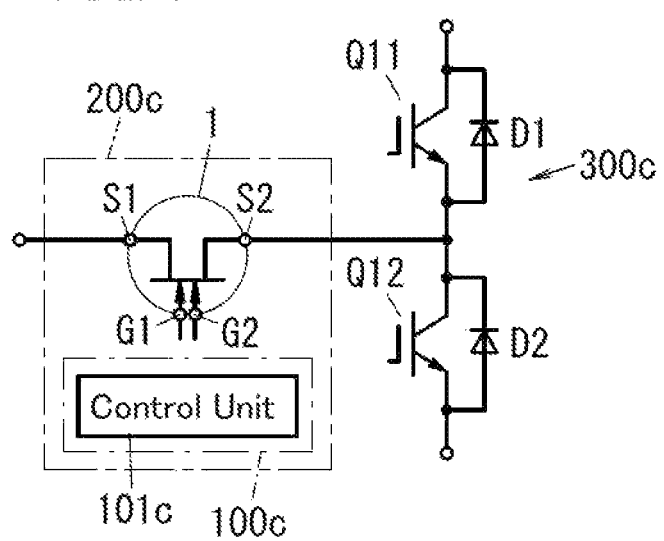
FIG. 9 is a circuit diagram of a power converter including a control system according to a third variation of the exemplary embodiment.

Next, a switch system 200c including a control system 100c according to a third variation of the exemplary embodiment and a power converter 300c including the switch system 200c will be described with reference to FIG. 9.

The power converter 300c is implemented as a T-type three-level converter. In this variation, the power converter 300c includes: a series circuit of two switching elements Q11, Q12; a diode D1 connected antiparallel to the switching element Q11; a diode D2 connected antiparallel to the switching element Q12; and the bidirectional switch element 1 connected to a node of connection between the two switching elements Q11, Q12. Each of the two switching elements Q11, Q12 is implemented as an insulated gate bipolar transistor (IGBT). In this power converter 300c, a power converting unit for performing power conversion includes: the series circuit of the two switching elements Q11, Q12; the diode D1 connected antiparallel to the switching element Q11; the diode D2 connected antiparallel to the switching element Q12; and the bidirectional switch element 1 connected to the node of connection between the two switching elements Q11, Q12. The power converter 300c includes: the power converting unit including the bidirectional switch element 1 and performing power conversion; and the control system 100c.

In the control system 100c that the power converter 300c includes, the control unit 101c controls the bidirectional switch element 1. In this variation, when turning the bidirectional switch element 1 ON, the control unit 101c controls the bidirectional switch element 1 to cause the time lag Δt (see FIG. 3) between the first timing and the second timing. The first timing is a timing when a voltage equal to or higher than a threshold voltage is applied to one gate electrode selected from the first gate electrode G1 and the second gate electrode G2. The one gate electrode is associated with one source electrode selected from the first source electrode S1 and the second source electrode S2 and having a lower potential than the other source electrode. The second timing is a timing when a voltage equal to or higher than a threshold voltage is applied to the other gate electrode associated with the other source electrode having a higher potential than the one source electrode. Note that the control unit 101c controls not only the bidirectional switch element 1 but also the two switching elements Q11, Q12 as well. However, the control unit 101c may also be configured to control only the bidirectional switch element 1.

Note that the embodiment described above is only one of various embodiments of the present disclosure and should not be construed as limiting. Rather, the embodiment described above may be readily modified in various manners depending on a design choice or any other factor without departing from the scope of the present disclosure.

For example, each of the first p-type nitride semiconductor layer 61 and the second p-type nitride semiconductor layer 62 does not have to be a p-type AlGaN layer but may also be a p-type GaN layer, for example.

Optionally, the bidirectional switch element 1 may include one or more nitride semiconductor layers between the buffer layer 3 and the first nitride semiconductor layer 4. Also, the buffer layer 3 does not have to have a single-layer structure but may also have a superlattice structure, for example.

Furthermore, the substrate 2 does not have to be a silicon substrate but may also be a GaN substrate, an SiC substrate, or a sapphire substrate, for example.

Also, the control system 100 may include, instead of the first gate driver circuit 102 and the second gate driver circuit 103, a first power supply and a second power supply to be controlled by the control unit 101. In that case, the first power supply is controlled by the control unit 101 and outputs a first gate voltage Vg1 and the second power supply is controlled by the control unit 101 and outputs a second gate voltage Vg2.

Furthermore, the power converter may have any configuration other than those of the power converters 300b, 300c described above.

(Resume)

The embodiments and their variations described above are implementations of the following aspects of the present disclosure.

A control system (100; 100a; 100b; 100c) according to a first aspect is designed to control a bidirectional switch element (1). The bidirectional switch element (1) includes a substrate (2), a first nitride semiconductor layer (4), a second nitride semiconductor layer (5), a first source electrode (S1), a first gate electrode (G1), a second gate electrode (G2), a second source electrode (S2), a first p-type nitride semiconductor layer (61), and a second p-type nitride semiconductor layer (62). The first nitride semiconductor layer (4) is formed over the substrate (2). The second nitride semiconductor layer (5) is formed on the first nitride semiconductor layer (4). The second nitride semiconductor layer (5) has a larger bandgap than the first nitride semiconductor layer (4). The first source electrode (S1), the first gate electrode (G1), the second gate electrode (G2), and the second source electrode (S2) are all formed over the second nitride semiconductor layer (5). The first p-type nitride semiconductor layer (61) is interposed between the first gate electrode (G1) and the second nitride semiconductor layer (5). The second p-type nitride semiconductor layer (62) is interposed between the second gate electrode (G2) and the second nitride semiconductor layer (5). The control system (100; 100a; 100b; 100c) includes a control unit (101; 101a; 101b; 101c). The control unit (101; 101a; 101b; 101c) controls, when turning the bidirectional switch element (1) ON, the bidirectional switch element (1) to cause a time lag (Δt) between a first timing and a second timing. The first timing is a timing when a voltage equal to or higher than a threshold voltage is applied to one gate electrode selected from the group consisting of the first gate electrode (G1) and the second gate electrode (G2). The one gate electrode is associated with one source electrode selected from the group consisting of the first source electrode (S1) and the second source electrode (S2) and having a lower potential than the other source electrode. The second timing is a timing when a voltage equal to or higher than a threshold voltage is applied to the other gate electrode associated with the other source electrode having a higher potential than the one source electrode.

The control system (100; 100a; 100b; 100c) according to the first aspect may increase the switching rate when turning the bidirectional switch element (1) ON.

In a control system (100; 100a; 100b; 100c) according to a second aspect, which may be implemented in conjunction with the first aspect, the control unit (101; 101a; 101b; 101c) makes the bidirectional switch element (1) operate as a diode in an interval between the first timing and the second timing. When operating as the diode, the bidirectional switch element (1) causes a current to flow from one source electrode selected from the group consisting of the first source electrode (S1) and the second source electrode (S2) and having the higher potential than the other source electrode to the other source electrode having the lower potential than the one source electrode without causing a current to flow from the other source electrode having the lower potential to the one source electrode having the higher potential.

The control system (100; 100a; 100b; 100c) according to the second aspect may increase the switching rate with more reliability when turning the bidirectional switch element (1) ON.

In a control system (100; 100a; 100b; 100c) according to a third aspect, which may be implemented in conjunction with the first or second aspect, the time lag (Δt) is equal to or longer than 50 nanoseconds.

The control system (100; 100a; 100b; 100c) according to the third aspect may ensure the time lag (Δt) even when there are any fluctuations or dispersions in the system.

In a control system (100; 100a; 100b; 100c) according to a fourth aspect, which may be implemented in conjunction with any one of the first to third aspects, the substrate (2) is electrically insulated from all of the first source electrode (S1), the second source electrode (S2), the first gate electrode (G1), and the second gate electrode (G2).

The control system (100; 100a; 100b; 100c) according to the fourth aspect may increase the switching rate with more reliability when turning the bidirectional switch element (1) ON, in a situation where the substrate (2) is electrically insulated from all of the first source electrode (S1), the second source electrode (S2), the first gate electrode (G1), and the second gate electrode (G2).

In a control system (100a) according to a fifth aspect, which may be implemented in conjunction with any one of the first to fourth aspects, the control unit (101a) includes a delay circuit (111) to cause the time lag (Δt).

The control system (100a) according to the fifth aspect may reduce a dispersion in the time lag (Δt).

In a control system (100; 100a; 100b; 100c) according to a sixth aspect, which may be implemented in conjunction with any one of the first to fifth aspects, the control unit (101; 101a; 101b; 101c) prevents, when turning the bidirectional switch element (1) OFF, the bidirectional switch element (1) from operating as a diode.

The control system (100; 100a; 100b; 100c) according to the sixth aspect may cut down the loss caused by the bidirectional switch element (1) when turning the bidirectional switch element (1) OFF.

A switch system (200; 200a; 200b; 200c) according to a seventh aspect includes: the control system (100; 100a; 100b; 100c) according to any one of the first to sixth aspects; and the bidirectional switch element (1).

The switch system (200; 200a; 200b; 200c) according to the seventh aspect may increase the switching rate when turning the bidirectional switch element (1) ON.

A power converter (300b; 300c) according to an eighth aspect includes the switch system (200b; 200c) according to the seventh aspect.

The power converter (300b; 300c) according to the eighth aspect may increase the switching rate when turning the bidirectional switch element (1) ON.

In a method for controlling a bidirectional switch element (1) according to a ninth aspect, the bidirectional switch element (1) includes a substrate (2), a first nitride semiconductor layer (4), a second nitride semiconductor layer (5), a first source electrode (S1), a first gate electrode (G1), a second gate electrode (G2), a second source electrode (S2), a first p-type nitride semiconductor layer (61), and a second p-type nitride semiconductor layer (62). The first nitride semiconductor layer (4) is formed over the substrate (2). The second nitride semiconductor layer (5) is formed on the first nitride semiconductor layer (4). The second nitride semiconductor layer (5) has a larger bandgap than the first nitride semiconductor layer (4). The first source electrode (S1), the first gate electrode (G1), the second gate electrode (G2), and the second source electrode (S2) are all formed over the second nitride semiconductor layer (5). The first p-type nitride semiconductor layer (61) is interposed between the first gate electrode (G1) and the second nitride semiconductor layer (5). The second p-type nitride semiconductor layer (62) is interposed between the second gate electrode (G2) and the second nitride semiconductor layer (5). The method for controlling the bidirectional switch element (1) includes controlling, when turning the bidirectional switch element (1) ON, the bidirectional switch element (1) to cause a time lag (Δt) between a first timing and a second timing. The first timing is a timing when a voltage equal to or higher than a threshold voltage is applied to one gate electrode selected from the group consisting of the first gate electrode (G1) and the second gate electrode (G2). The one gate electrode is associated with one source electrode selected from the group consisting of the first source electrode (S1) and the second source electrode (S2) and having a lower potential than the other source electrode. The second timing is a timing when a voltage equal to or higher than a threshold voltage is applied to the other gate electrode associated with the other source electrode having a higher potential than the one source electrode.

The method for controlling the bidirectional switch element according to the ninth aspect may increase the switching rate when turning the bidirectional switch element (1) ON.

A program according to a tenth aspect is designed to cause a computer system to perform delay processing. The computer system controls a bidirectional switch element (1). The bidirectional switch element (1) includes a substrate (2), a first nitride semiconductor layer (4), a second nitride semiconductor layer (5), a first source electrode (S1), a first gate electrode (G1), a second gate electrode (G2), a second source electrode (S2), a first p-type nitride semiconductor layer (61), and a second p-type nitride semiconductor layer (62). The first nitride semiconductor layer (4) is formed over the substrate (2). The second nitride semiconductor layer (5) is formed on the first nitride semiconductor layer (4). The second nitride semiconductor layer (5) has a larger bandgap than the first nitride semiconductor layer (4). The first source electrode (S1), the first gate electrode (G1), the second gate electrode (G2), and the second source electrode (S2) are all formed over the second nitride semiconductor layer (5). The first p-type nitride semiconductor layer (61) is interposed between the first gate electrode (G1) and the second nitride semiconductor layer (5). The second p-type nitride semiconductor layer (62) is interposed between the second gate electrode (G2) and the second nitride semiconductor layer (5). The delay processing includes causing, when turning the bidirectional switch element (1) ON, a time lag (Δt) between a first timing and a second timing. The first timing is a timing when a voltage equal to or higher than a threshold voltage is applied to one gate electrode selected from the group consisting of the first gate electrode (G1) and the second gate electrode (G2). The one gate electrode is associated with one source electrode selected from the group consisting of the first source electrode (S1) and the second source electrode (S2) and having a lower potential than the other source electrode. The second timing is a timing when a voltage equal to or higher than a threshold voltage is applied to the other gate electrode associated with the other source electrode having a higher potential than the one source electrode.

The program according to the tenth aspect may increase the switching rate when turning the bidirectional switch element (1) ON.

REFERENCE SIGNS LIST

1 Bidirectional Switch Element
2 Substrate
4 First Nitride Semiconductor Layer
5 Second Nitride Semiconductor Layer
61 First p-type Nitride Semiconductor Layer
62 Second p-type Nitride Semiconductor Layer
G1 First Gate Electrode
G2 Second Gate Electrode
S1 First Source Electrode
S2 Second Source Electrode
100, 100a, 100b, 100c Control System
101, 101a, 101b, 101c Control Unit
111 Delay Circuit
200, 200a, 200b, 200c Switch System
300b, 300c Power Converter
Δt Time Lag

The invention claimed is:

1. A control system for controlling a bidirectional switch element, the bidirectional switch element comprising:
a substrate;
a first nitride semiconductor layer formed over the substrate;
a second nitride semiconductor layer formed on the first nitride semiconductor layer and having a larger bandgap than the first nitride semiconductor layer;
a first source electrode, a first gate electrode, a second gate electrode, and a second source electrode, all of which are formed over the second nitride semiconductor layer;
a first p-type nitride semiconductor layer interposed between the first gate electrode and the second nitride semiconductor layer; and
a second p-type nitride semiconductor layer interposed between the second gate electrode and the second nitride semiconductor layer, the control system including a control unit,
the substrate being electrically insulated from each of the first source electrode, the second source electrode, the first gate electrode, and the second gate electrode,
the substrate of the bidirectional switch element electrically floating,
the control unit being configured to, when turning the bidirectional switch element ON, control the bidirectional switch element to cause a time lag between a first timing and a second timing,
the first timing being a timing when a voltage equal to or higher than a threshold voltage is applied to one gate electrode selected from a group consisting of the first gate electrode and the second gate electrode, the one gate electrode being associated with one source electrode selected from the group consisting of the first source electrode and the second source electrode and having a lower potential than the other source electrode, the second timing being a timing when a voltage equal to or higher than a threshold voltage is applied to the other gate electrode associated with the other source electrode having a higher potential than the one source electrode.

2. The control system of claim 1, wherein
the control unit is configured to make the bidirectional switch element operate as a diode in an interval between the first timing and the second timing, and
when operating as the diode, the bidirectional switch element causes a current to flow from one source electrode selected from the group consisting of the first source electrode and the second source electrode and having the higher potential than the other source electrode to the other source electrode having the lower potential than the one source electrode without causing a current to flow from the other source electrode having the lower potential to the one source electrode having the higher potential.

3. The control system of claim 1, wherein the time lag is equal to or longer than 50 nanoseconds.

4. The control system of claim 1, wherein the control unit includes a delay circuit configured to cause the time lag.

5. The control system of claim 1, wherein the control unit is configured to, when turning the bidirectional switch element OFF, prevent the bidirectional switch element from operating as a diode.

6. A switch system comprising:
the control system of claim 1; and
the bidirectional switch element.

7. A power converter comprising:
a power converting unit for performing power conversion; and
the switch system of claim 6,
wherein the power converting unit includes the bidirectional switch element.

8. A method for controlling a bidirectional switch element, the bidirectional switch element comprising:
a substrate;
a first nitride semiconductor layer formed over the substrate;
a second nitride semiconductor layer formed on the first nitride semiconductor layer and having a larger bandgap than the first nitride semiconductor layer;
a first source electrode, a first gate electrode, a second gate electrode, and a second source electrode, all of which are formed over the second nitride semiconductor layer;

a first p-type nitride semiconductor layer interposed between the first gate electrode and the second nitride semiconductor layer; and a second p-type nitride semiconductor layer interposed between the second gate electrode and the second nitride semiconductor layer, the substrate being electrically insulated from each of the first source electrode, the second source electrode, the first gate electrode, and the second gate electrode, the substrate of the bidirectional switch element electrically floating, the method including controlling, when turning the bidirectional switch element ON, the bidirectional switch element to cause a time lag between a first timing and a second timing, the first timing being a timing when a voltage equal to or higher than a threshold voltage is applied to one gate electrode selected from a group consisting of the first gate electrode and the second gate electrode, the one gate electrode being associated with one source electrode selected from the group consisting of the first source electrode and the second source electrode and having a lower potential than the other source electrode, the second timing being a timing when a voltage equal to or higher than a threshold voltage is applied to the other gate electrode associated with the other source electrode having a higher potential than the one source electrode.

9. A non-transitory storage medium storing a program designed to cause a computer system to perform delay processing, the computer system being configured to control a bidirectional switch element, the bidirectional switch element including:

a substrate;

a first nitride semiconductor layer formed over the substrate;

a second nitride semiconductor layer formed on the first nitride semiconductor layer and having a larger bandgap than the first nitride semiconductor layer;

a first source electrode, a first gate electrode, a second gate electrode, and a second source electrode, all of which are formed over the second nitride semiconductor layer;

a first p-type nitride semiconductor layer interposed between the first gate electrode and the second nitride semiconductor layer; and a second p-type nitride semiconductor layer interposed between the second gate electrode and the second nitride semiconductor layer, the substrate being electrically insulated from each of the first source electrode, the second source electrode, the first gate electrode, and the second gate electrode, the substrate of the bidirectional switch element electrically floating, the delay processing including causing, when turning the bidirectional switch element ON, a time lag between a first timing and a second timing, the first timing being a timing when a voltage equal to or higher than a threshold voltage is applied to one gate electrode selected from a group consisting of the first gate electrode and the second gate electrode, the one gate electrode being associated with one source electrode selected from the group consisting of the first source electrode and the second source electrode and having a lower potential than the other source electrode, the second timing being a timing when a voltage equal to or higher than a threshold voltage is applied to the other gate electrode associated with the other source electrode having a higher potential than the one source electrode.

* * * * *